(12) United States Patent
Liu et al.

(10) Patent No.: US 6,259,140 B1
(45) Date of Patent: Jul. 10, 2001

(54) SILICIDE BLOCKING PROCESS TO FORM NON-SILICIDED REGIONS ON MOS DEVICES

(75) Inventors: Meng-Hwang Liu, Taiwan; Cheng-Shang Lai, Taichung; Tao-Cheng Lu, Kaohsiung; Mam-Tsung Wang, Hsinchu, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/410,360

(22) Filed: Sep. 30, 1999

Related U.S. Application Data

(62) Division of application No. 09/243,552, filed on Feb. 2, 1999, now Pat. No. 6,121,092.

(51) Int. Cl.[7] .................................................. H01L 23/62
(52) U.S. Cl. ......................... 257/360; 257/355; 257/356; 257/384; 257/408
(58) Field of Search ..................................... 438/279, 286, 438/303, 224, 596, 683; 257/336, 355, 356, 360, 384, 408

(56) References Cited

U.S. PATENT DOCUMENTS

| | | | |
|---|---|---|---|
| 4,918,811 | * 4/1990 | Eichelberger | 29/840 |
| 5,262,344 | * 11/1993 | Mistry | 437/57 |
| 5,283,449 | 2/1994 | Ooka | 257/204 |
| 5,342,798 | 8/1994 | Huang | 437/41 |
| 5,516,717 | * 5/1996 | Hsu | 437/56 |
| 5,532,178 | * 7/1996 | Liaw et al. | 437/57 |
| 5,589,423 | 12/1996 | White et al. | 437/228 |
| 5,619,052 | 4/1997 | Chang et al. | 257/321 |
| 5,672,527 | 9/1997 | Lee | 437/41 RLD |
| 5,744,839 | * 4/1998 | Ma et al. | 257/356 |
| 5,834,351 | 11/1998 | Chang et al. | 438/266 |
| 5,920,774 | * 7/1999 | Wu | 438/224 |
| 6,004,838 | * 12/1999 | Ma | 438/200 |
| 6,020,242 | * 2/2000 | Tsai et al. | 438/279 |
| 6,046,087 | * 4/2000 | Lin | 438/279 |
| 6,110,771 | * 8/2000 | Ahn | 438/200 |
| 6,121,092 | * 9/2000 | Liu | 438/281 |
| 6,156,593 | * 12/2000 | Peng | 438/200 |

OTHER PUBLICATIONS

Anderson et al., "ESD protection for Mixed–Voltage I/O Using NMOS Transistors Stacked in a Cascade Configuration," ESQ/ESD Symposium 98–61, pp. 2A.1.1.–2A.1.9.

* cited by examiner

*Primary Examiner*—Mary Wilczewski
*Assistant Examiner*—David Goodwin
(74) *Attorney, Agent, or Firm*—Mark A. Haynes; Haynes & Beffel LLP

(57) ABSTRACT

A semiconductor device is formed on a substrate having an ESD region and an internal region. A protective layer is formed over a portion of the ESD region to be protected from formation of silicide and suicide is formed on portions of the Internal and ESD region which remain unprotected by the protective layer. A portion of the protective layer is removed to form the remaining portions of the protective layer into sidewall spacers adjacent to a gate electrode included in the ESD region.

14 Claims, 7 Drawing Sheets

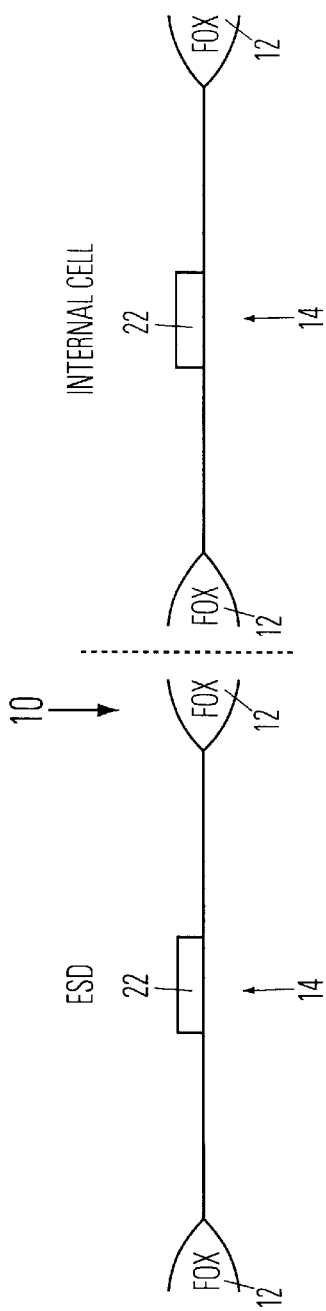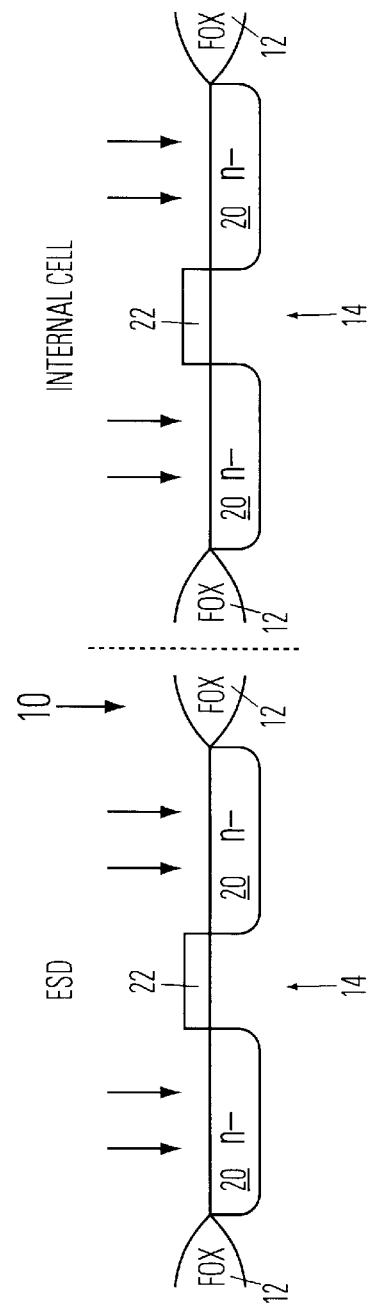

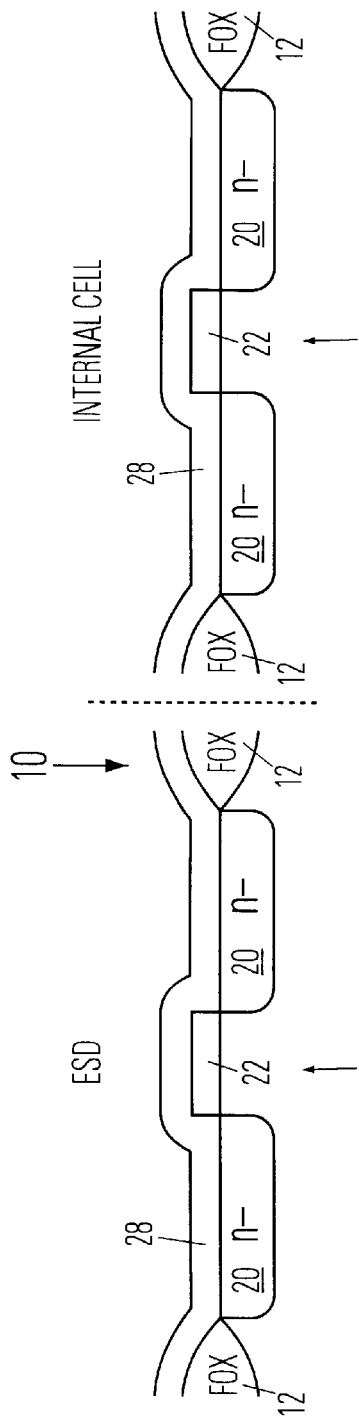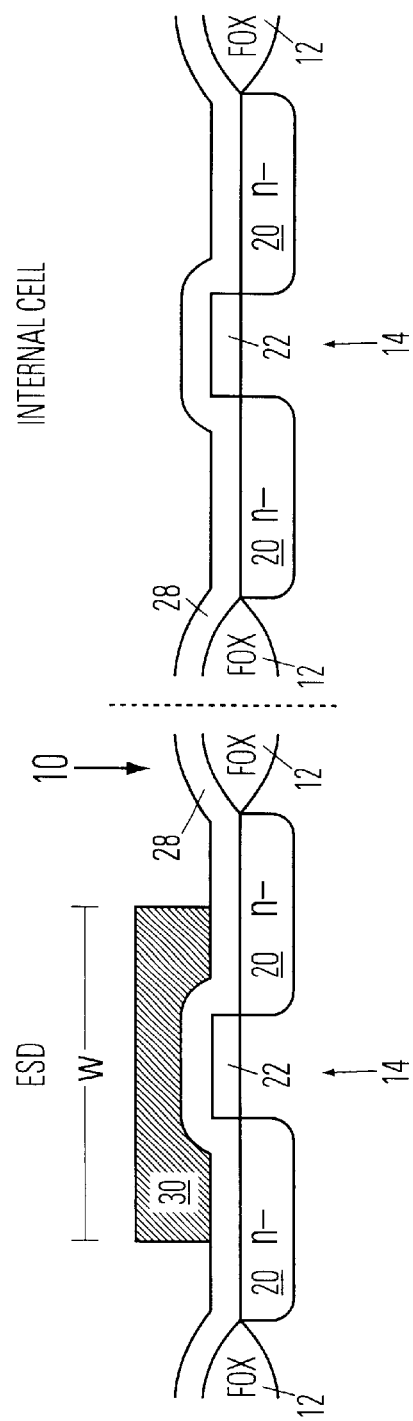

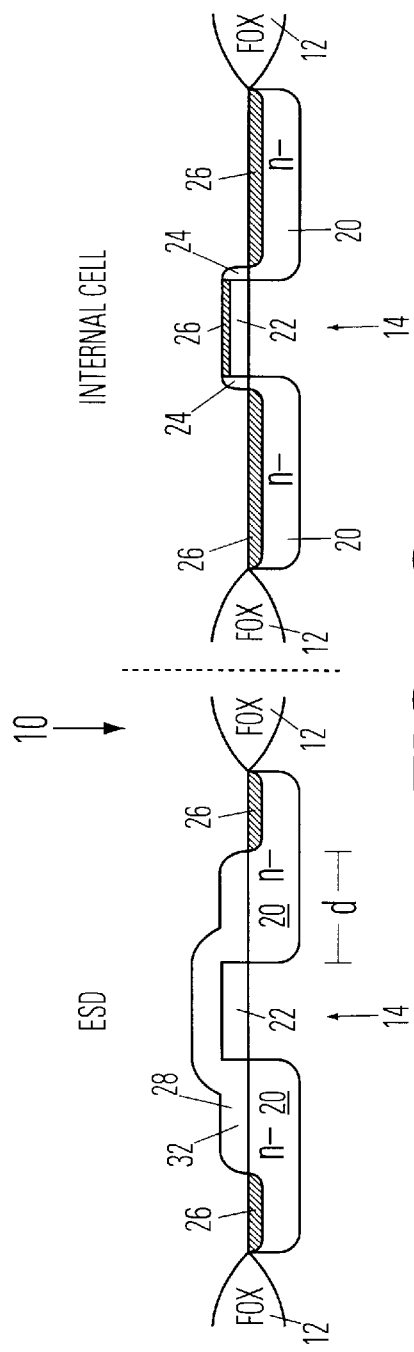
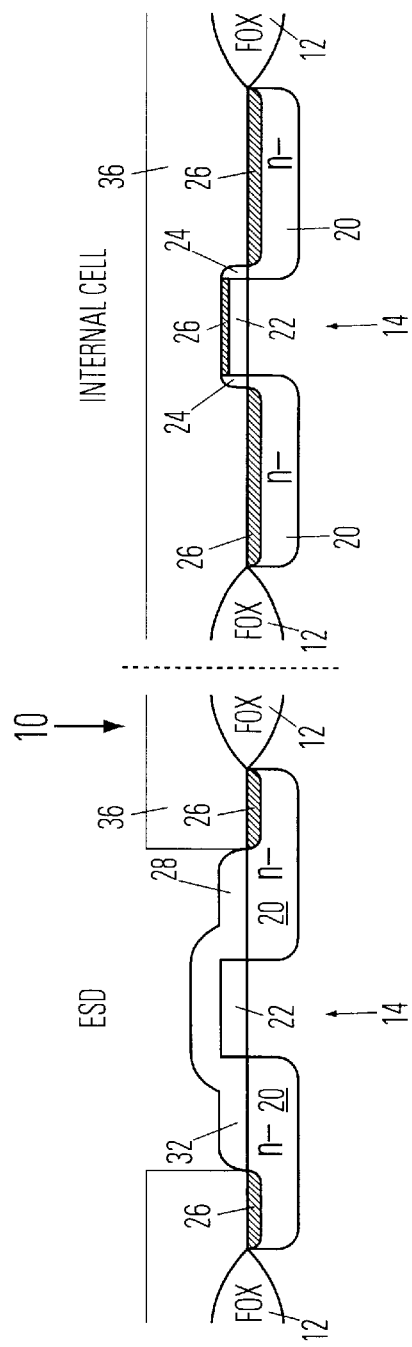
FIG. 2G
FIG. 2H

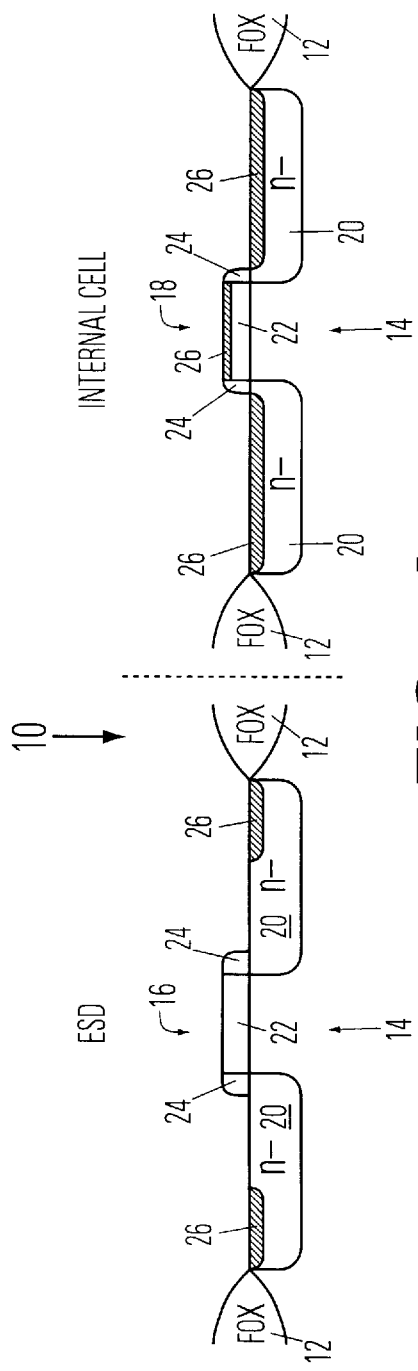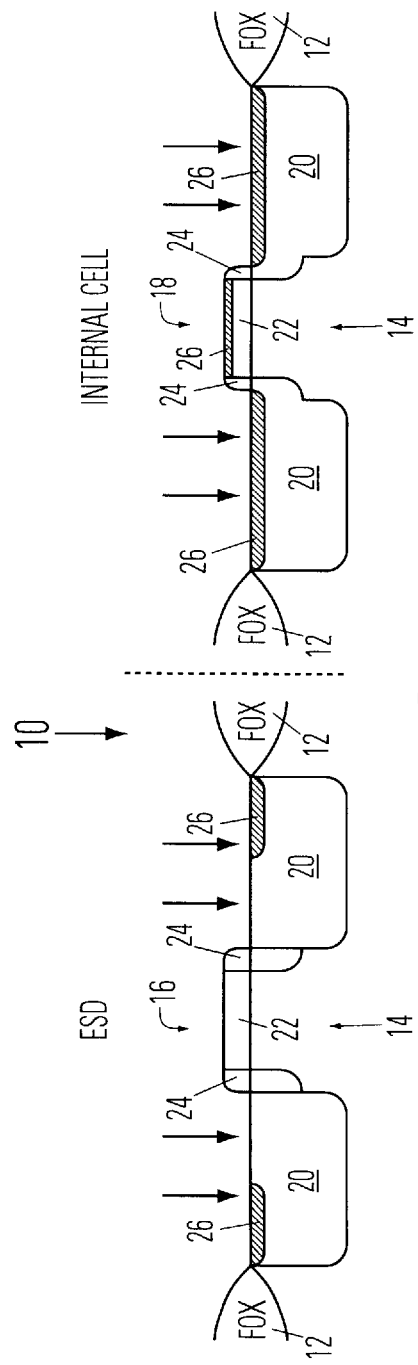

SILICIDE BLOCKING PROCESS TO FORM NON-SILICIDED REGIONS ON MOS DEVICES

This application is a division of U.S. patent application Ser. No. 09/243,552, filed Feb. 2, 1999, now U.S. Pat. No. 6,121,092.

BACKGROUND OF THE INVENTION

1. Field of the Invention

This invention relates to semiconductor devices which are protected from damage resulting from electrostatic discharge (ESD). More specifically, this invention relates to semiconductor devices having selectively silicided ESD transistors.

2. Description of Related Art

Gates of metal-oxide semiconductor (MOS) transistors receive input signals and transfer output signals in the form of a voltage. The gate oxide can break down if the applied voltage exceeds certain levels. Such excess voltages are often the result of human-operator or mechanical handling operations. Triboelectricity is an electrical charge which evolves when two materials are rubbed together. Human operators can create this type of electricity by walking across a room or by removing an integrated circuit (IC) from its plastic package. Triboelectricity results in high voltage, which when applied to a semiconductor device in the form of electrostatic discharge (ESD) can cause breakdown of the gate oxide or overheating due to overcurrent. This breakdown can cause immediate or expedited destruction of transistors and other devices.

In order to combat problems associated with ESD events, manufacturers of MOS devices design protection devices that provide paths through which to discharge nodes rapidly. Protection devices frequently include a transistor positioned between the input buffer or output buffer pads of a device and the respective gates to which the pads are connected. This transistor is often referred to as an ESD transistor. During an ESD event, a typical ESD transistor enters snap-back, a low resistance regime in which large amounts of current are conducted.

Certain processing enhancements, such as siliciding source/drain regions, increase the performance of small-dimension devices, but often negate the benefits of ESD transistors. These silicided regions are often positioned near the drain junction of the ESD transistors. The drain junction is a major source of heat during an ESD event. The proximity of the silicide to the drain junction frequently causes the silicide to melt during an ESD event which further causes breakdown of the semiconductor device.

One attempt to reduce the exposure of the silicide to heat has been to increase the gate-to-contact spacing in ESD transistors. However, this increased length adds resistance that impedes the current discharging through the ESD transistor. Thus, current tends to flow through other transistors on the semiconductor device before discharging through the ESD transistor. Accordingly, the increased resistance can negate the benefits of the protection device.

Another problem associated with silicided source/drain regions in a protection device is known as the "ballasting" effect. Due to the greatly reduced resistance of silicided regions during an ESD event, the current discharging through the ESD transistor may collapse into a thin filament. This collapse can lead to increased heating and premature device failure.

Many of the difficulties associated with silicide can be solved by selectively blocking silicide formation on the source, drain and/or gate electrode of the ESD transistors in semiconductor devices. Techniques for selective blocking of silicide formation frequently require two or more independent N+ implants, formation of multiple oxide layers and/or three or more masking steps. Multiple implants, oxide layer formations and maskings add to the costs and difficulty of semiconductor manufacture. Accordingly, there is a need for a process of creating semiconductor devices while reducing the number of N+ implants, oxide layer formation, and masking steps.

SUMMARY OF THE INVENTION

A method for forming a semiconductor device on a substrate having an ESD region and an internal region is disclosed. The method includes forming a protective layer over a portion of the ESD region which includes a gate electrode and then forming silicide on at least a portion of the internal region. The protective layer protects the portion of the ESD region from the formation of silicide. The method also includes removing a portion of the protective layer such that the remaining protective layer forms sidewall spacers on the gate electrode in the ESD region.

The provided method can also include forming a mask over portions of the ESD region and the internal region which are not protected by the protective layer after forming the silicide and then removing the mask concurrently with removing the portion of the protective layer.

Another embodiment of the method includes forming a protective layer over a portion of the ESD region and then forming silicide on at least a portion of the internal region. The protective layer protects the portion of the ESD region from the formation of silicide. The method also includes forming a mask on portions of the ESD region and the internal region which are not protected by the protective layer and removing the mask and a portion of the protective layer.

A semiconductor device manufactured by the above methods is also provided.

The methods can also include introducing N− type impurities into source/drain portions defined on the ESD and internal regions before forming the protective layer. Further, the methods can also include introducing additional N+ type impurities into source/drain portions defined on the ESD and internal regions after removing the portion of the protective layer.

Forming the protective layer can include forming an oxide layer over the ESD and internal regions and then forming a second mask on the oxide layer. The second mask on the oxide layer is formed over the portion of the ESD region to be protected from formation of silicide. Forming the protective layer can also include etching the mask and oxide layer to form the oxide layer into the protective layer. Etching the mask and oxide layers can form the oxide layer into spacers adjacent to a gate on the internal region.

BRIEF DESCRIPTION OF THE FIGURES

FIG. 2A is a cross section of a substrate partitioned into an ESD region and an internal region.

FIG. 2B illustrates an ion implant to form N− type source/drain regions.

FIG. 2C illustrates an oxide layer deposited on the ESD and internal regions.

FIG. 2D illustrates a mask formed on the oxide layer and positioned over a portion of the ESD region to be protected from formation of silicide.

FIG. 2G illustrates the titanium film of FIG. 2F formed into silicide films.

FIG. 2H illustrates a mask formed over portions of the ESD internal regions which are not protected by the protective layer formed in FIG. 2E.

FIG. 2I illustrates the protective layer of FIG. 2E formed into sidewall spacers adjacent a gate electrode in the ESD region.

FIG. 2J illustrates an ion implant to form N+ type source/drain regions.

DETAILED DESCRIPTION

The invention relates to a method for forming semiconductor devices with ESD protection circuits. The method includes forming an ESD transistor on an ESD portion of a substrate and forming at least one additional transistor on an internal region of the substrate. A protective layer is formed over portions of the ESD region which are to be protected from the formation of silicide. Silicide is then formed on portions of the ESD and internal regions which are not protected by the protective layer. According to the method, the protective layer can be selectively formed over the gate electrode, source and/or drain portions of the ESD region. As a result, the user can select whether the gate, source and/or drain portions of the ESD region will be protected from the formation of silicide.

The protective layer can be formed by depositing an oxide layer over both the ESD and internal regions and then forming a photoresist over the portions of the ESD region which are to be protected from the formation of the suicide. The photoresist acts as a mask during an etch which forms the oxide layer into the protective layer. The etch can be a directional etch which also forms the oxide layer into sidewall adjacent to a gate electrode in the internal region. Silicide films are formed after the formation of the protective layer and sidewall spacers. After formation of the silicide, an additional etch can be performed which forms the protective layer into sidewall spacers adjacent to a gate electrode in the ESD portion. As a result, the single oxide layer can protect portions of the ESD region from silicide formation and provide sidewall spacers on gate electrodes in both the ESD and internal regions.

An N+ type implant is performed after the formation of the silicide and the sidewall spacers. The implant provides N+ type source/drain regions which are self aligned with respect to the sidewall spacers in both the ESD and internal regions. Accordingly, the method requires a single N+ implantation.

Additionally, an N− type implant can be performed before the formation of the protective layer. This implant provides N− type source/drain regions which are self aligned with respect to gate electrodes included in both the ESD and internal regions. Subsequent formation of sidewall spacers adjacent the gate electrodes followed by the N+ type implant which is self-aligned with the sidewall spacers provides lightly doped drain (LDD) structures in both the ESD and internal regions.

Figure 1:
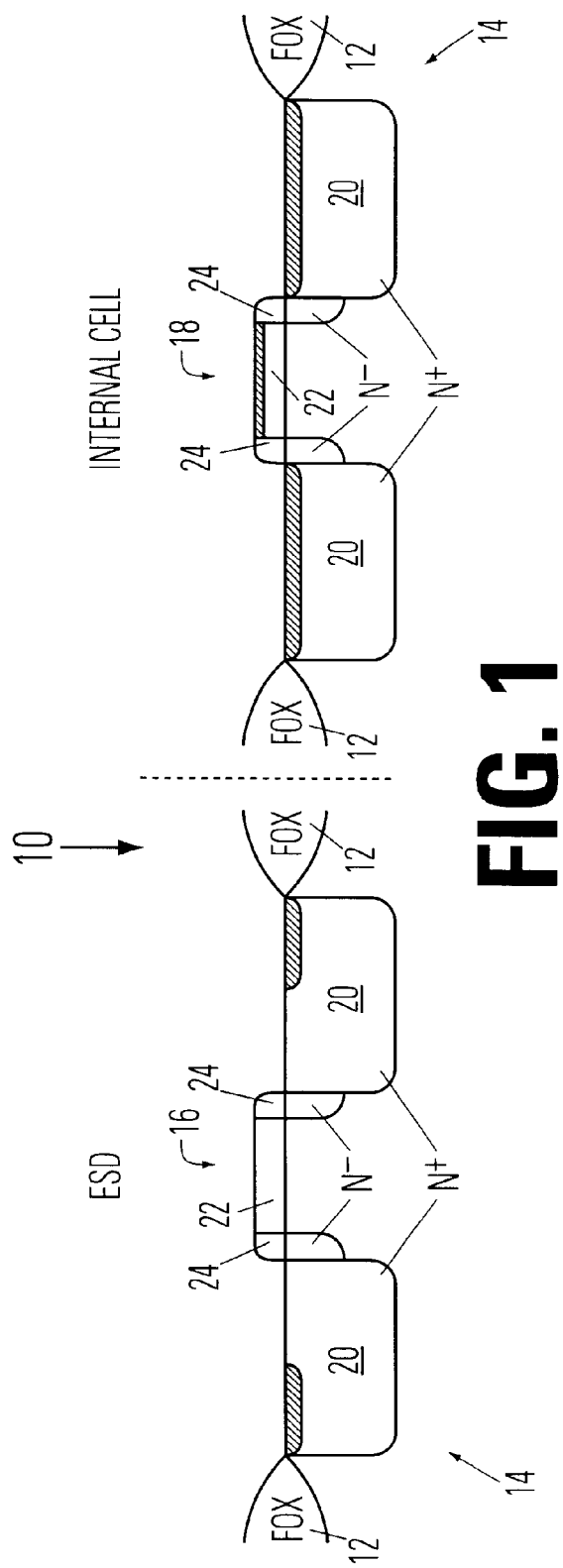
FIG. 1 is a cross sectional view of the ESD and internal regions of a semiconductor device formed by the methods of the present invention.

FIG. 1 provides a side view of a portion of a semiconductor device which can be created with the methods of the present invention. The semiconductor device 10 includes field oxides 12 or other isolation structures formed on a substrate 14. The field oxides 12 partition the substrate 14 into ESD regions and internal regions. A gate oxide is formed on the substrate 14 in the ESD and internal regions. Due to the relative thinness of the gate oxide as compared to the substrate 14 and field oxides 12, the gate oxide is not illustrated.

An N channel MOS transistor is formed in the ESD and internal regions. The transistor formed in the ESD region will be called an ESD transistor 16 and the transistor formed in the internal region will be called an internal transistor 18. The ESD and internal transistors 16, 18 both have LDD structured source/drain regions 20. Specifically, each transistor has N− type source/drain regions 20 aligned on the gate side with an associated gate electrode 22. Each transistor also has N+ type source/drain regions 20 partially overlapping the N− regions and aligned on the gate side with sidewall spacers 24 on the associated gate electrode 22. The N+ and N− type source drain regions can be formed by an implant for example.

The ESD and internal transistors 16, 18 have silicided films 26 which serve as contacts for coupling the transistors to metal interconnecting layers (not shown). The internal transistor 18 has silicide films 26 formed on the source/drain regions 20 and on the associated gate electrode 22. The silicide films 26 are self aligned with the sidewall spacers 24 adjacent to the gate electrode 22. The ESD transistor 16 has silicide films 26 formed at a distance d between the inner edge of the silicide film 26 and the gate electrode 22. This distance is often called the contact to gate distance. Since the main area of heating during an ESD event is the drain junction, this spacing separates the heat generating area from the silicide films 26 and accordingly reduces the likelihood of the silicide film 26 melting during an ESD event.

FIGS. 2A–2J illustrate an embodiment of a method for forming the semiconductor device 10 illustrated in FIG. 1. The semiconductor device illustrated in FIG. 1 and the method illustrated in FIGS. 2A–2J are single embodiments of the present invention and are disclosed for illustrative purposes only. Other embodiments of methods and devices are described throughout this application and are contemplated as falling within the scope of the present invention.

FIG. 2A illustrates a P type silicon substrate 14 for use with the present invention. Field oxides 12 having a thickness of about 800 nm are formed on the surface of the substrate 14 by a selective oxidation method. The field oxides 12 define an ESD region and an internal region on the substrate 14. A transistor corresponding to the ESD transistor 16 illustrated in FIG. 1 will be formed in the ESD region and a transistor corresponding to the buffer transistors illustrated in FIG. 1 will be formed in the internal circuit region.

A gate oxide of about 7 nm thickness is formed in the ESD and internal regions using a dry thermal oxidation process. The gate oxide is not illustrated due to its relative thickness. Gate electrodes 22 having a polycide structure are formed in the ESD and internal regions.

The N− type source/drain regions 20 illustrated in FIG. 2B are formed by ion implantation of a dopant such as phosphorus. The N− type source/drain regions 20 are self aligned with respect to the gate electrodes 22. The implantation energy is in the range of about 20 to 100 keV and a dose of about $1\times10^{13}$ atoms/cm².

FIG. 2C illustrates deposition of an oxide layer 28 of about 200 nm deposited over both the ESD region and the internal region.

Figure 2E:
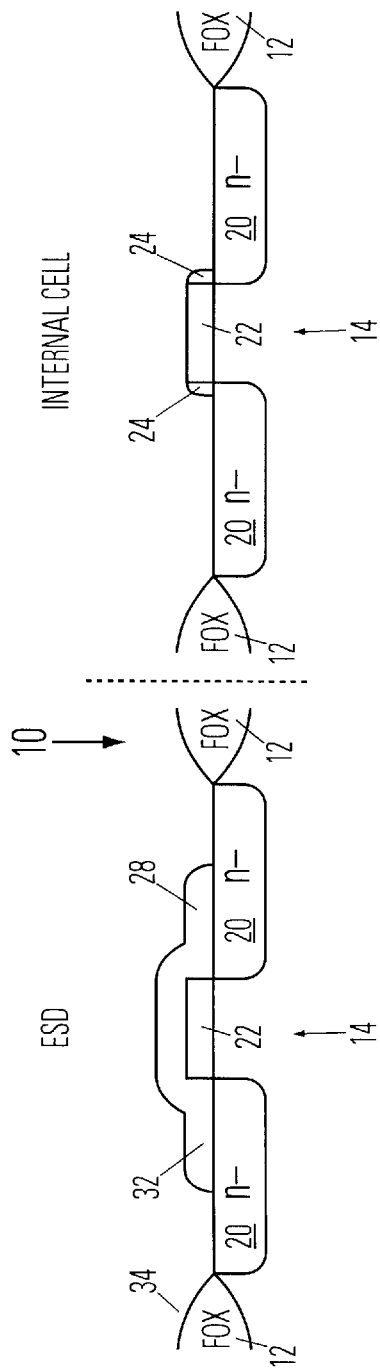
FIG. 2E illustrates the oxide layer formed into sidewall spacers and a protective layer which protects portions of the ESD region from formation of silicide.

FIG. 2D illustrates formation of a photoresist 30 on the oxide layer 28. The photoresist 30 is formed over a portion of the ESD region which is to be protected from the formation of silicide. As illustrated in FIG. 2E, the oxide layer 28 is formed into a protective layer 32 by performing an etch using the photoresist 30 as a mask. The etch can be a directional etch such as a reactive ion etch. A directional etch leaves sidewall spacers 24 where the oxide layer 28 thickness has built up near the gate electrode 22 in the internal region.

Figure 2F:
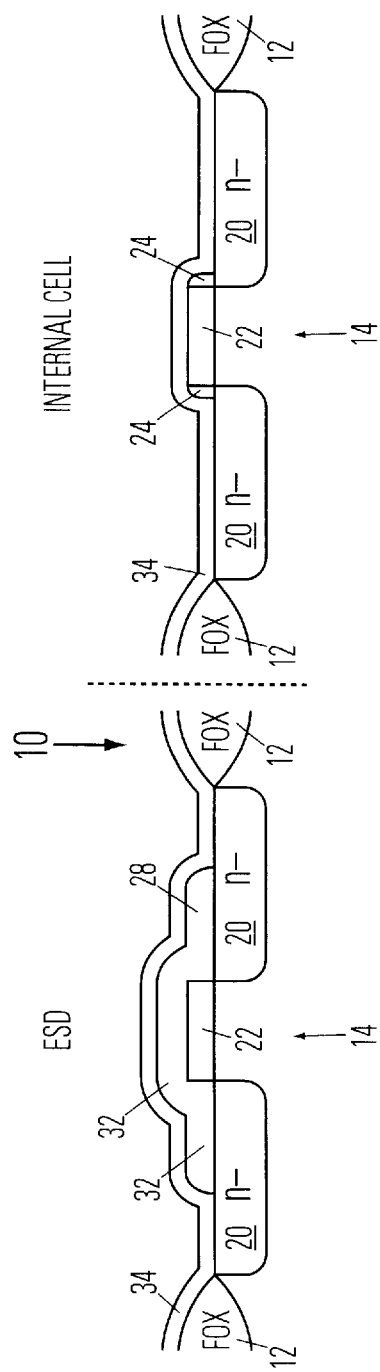
FIG. 2F illustrates a titanium film formed over the ESD and internal regions.

FIG. 2F illustrates a titanium film 34 with a thickness of about 100 nm is deposited in the ESD and internal regions by a sputtering technique. The titanium film 34 is heat treated in an inert atmosphere at about 600 to 800° C. to provide the silicide films 26 illustrated in FIG. 2G. Any unreacted portion of the titanium film 34 can be removed by etching. Other suitable metals for forming the silicide film include, but are not limited to, platinum, nickel and tungsten.

FIG. 2H illustrates the addition of a second photoresist 36 covering portions of the ESD and internal regions which were not previously covered by the protective layer 32. An etch is performed using the second photoresist 36 as a mask. As illustrated in FIG. 2I, the etch leaves sidewall spacers 24 adjacent to the gate electrode 22 in the ESD region. These sidewall spacers 24 are formed from the same oxide layer 28 as the spacers 24 illustrated in FIG. 2E. Accordingly, a single oxide deposition is required for the formation of the sidewall spacers 24.

In FIG. 2J, N+ type source/drain diffused layers are formed by an arsenic ion implantation. The N+ type source/drain regions 20 are self aligned with respect to the sidewall spacers 24 on the gate electrodes 22. The ion implantation conditions can include an implantation energy in the range of 70–100 keV and a dose of $1\times10^{5}$–$5\times10^{5}$ atoms/cm2.

As illustrated in FIGS. 2D–2G, the photoresist 30 is formed on the oxide layer 28 over the portions of the ESD region which are to be protected from the formation of the silicide film 26. Accordingly, the photoresist 30 can be formed over the entire source/drain regions 20 in addition to being formed over the gate electrode 22. This embodiment of the method would prevent the formation of silicide film 26 within any portion of the ESD region.

As is also illustrated in FIGS. 2D–2G, the width of the photoresist 30, W, determines the displacement between the edge of the silicide film 26 and the gate electrode 22, d, also called the contact to gate distance. As described above, increasing d can help to reduce breakdown of the suicide film 26 by increasing the distance between the silicide film 26 and the heat source. Accordingly, W can be adjusted to alter the breakdown characteristics of the silicide films 26 in the ESD region.

Figure 3:
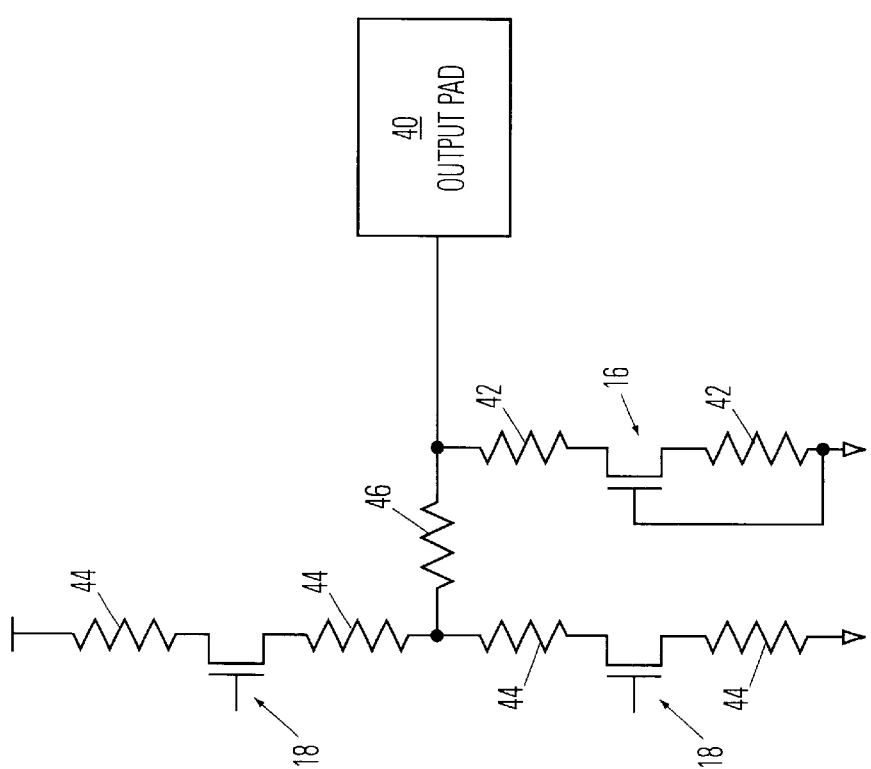
FIG. 3 is a schematic of a portion of a circuit which can be created on a semiconductor device created according to the present invention.

Metal connectors can be formed between the transistors fabricated as described above to create the circuit illustrated in FIG. 3. The circuit includes an ESD transistor 16 coupled in parallel with two internal transistors 18 which are coupled in series. The ESD transistor 16 is coupled between the internal transistors 18 and the input/output buffer pad 40 which serves as the source of the electrostatic energy which causes the ESD event.

The resistance associated with the gate to contact spacing in the ESD transistor 16 is illustrated as first resistors 42 and the resistance associated with the gate to contact spacing in the internal transistors 18 is illustrated as second resistors 44. When the total resistance from the first resistors 42 is less than the total resistance from the second resistors 44, the electrostatic energy from an ESD event will automatically discharge through the ESD transistor 16.

However, the contact to gate distance, d, in the ESD transistor 16 can be increased in accordance with the present invention. This increase in d increases the resistance represented by the first resistors 42. This increase can cause the total resistance from the first resistors 42 to exceed the total resistance from the second resistors 44. To overcome this difficulty, a third resistor 46 can be added to the circuit. When the third resistor 46 is included and the total resistance from the first resistors is less than the total resistance from the second and third resistors, the electrostatic energy from an ESD event will automatically discharge through the ESD transistor 16. The third resistor 46 can be an N− well resistor formed in the substrate 14 or other suitable resistor coupled between the ESD and internal transistors 16, 18.

Although the above fabrication method and devices have been described with respect to N-channel MOS transistors, the fabrication method is also applicable to P-channel MOS transistors. Further, the method is also applicable to CMOS transistors and bi-CMOS transistors.

While the present invention is disclosed by reference to the preferred embodiments and examples detailed above, it is to be understood that these examples are intended in an illustrative rather than limiting sense, as it is contemplated that modifications and combinations will readily occur to those skilled in the art, which modifications and combinations will be within the spirit of the invention and the scope of the appended claims.

What is claimed is:

1. A semiconductor device manufactured by a process comprising:

providing a substrate having an ESD region and an internal region;

forming a protective layer over a portion of the ESD region which includes a gate electrode, and not over other portions of the ESD region;

forming silicide on at least a portion of the internal region, the protective layer protecting the portion of the ESD region from the formation of silicide, wherein forming the suicide includes forming silicide on said other portions of the ESD region which are not protected by the protective layer;

removing a portion of the protective layer such that the remaining protective layer forms sidewall spacers on the gate electrode in the ESD region; and establishing a LDD drain region, adjacent the gate electrode using the sidewall spacers in the ESD region.

2. The device of claim 1, further comprising:

creating N− type source/drain regions in the substrate before forming the protective layer.

3. The device of claim 1, wherein the protective layer includes an oxide layer.

4. The device of claim 1, wherein forming a protective layer includes forming an oxide layer over the ESD and internal regions, forming a mask on the oxide layer, the mask formed over the portion of the ESD region to be protected from formation of silicide, and etching the mask and oxide layer to form the oxide layer into the protective layer.

5. The device of claim 1, further comprising:

forming a second mask on portions of the ESD region and the internal region which are not protected by the protective layer, the second mask being formed after forming the silicide; and removing the second mask concurrently with removing the portion of the protective layer.

6. The device of claim 1, further comprising:

creating N+ type source/drain regions in the substrate after removing the portions of the protective layer.

7. A semiconductor device manufactured by a process comprising:

providing a substrate having an ESD region and an internal region;

forming a protective layer over a portion of the ESD region, and not over other portions of the ESD region;

forming silicide on at least a portion of the internal region, the protective layer protecting the portion of the ESD region from the formation of silicide, wherein forming the silicide includes forming silicide on said other portions of the ESD region which are not protected by the protective layer;

forming a mask on portions of the ESD region and the internal region which are not protected by the protective layer;

removing the mask and a portion of the protective layer; and establishing a LDD drain region adjacent the gate electrode in the ESD region.

8. The device of claim 7, further comprising:

creating N− type source/drain regions in the substrate before forming the protective layer.

9. The device of claim 7, wherein the protective layer includes an oxide layer.

10. The device of claim 7, wherein forming a protective layer includes forming an oxide layer over the ESD and internal regions, forming a second mask on the oxide layer, the second mask formed over the portion of the ESD region to be protected from formation of silicide, and etching the second mask and oxide layer to form the oxide layer into the protective layer.

11. The device of claim 7, further comprising:

creating N− type source/drain regions in the substrate after removing the mask and a portion of the protective layer.

12. The device of claim 7, wherein removing the mask and a portion of the protective layer forms the protective layer into sidewall spacers on a ate electrode included in the ESD region.

13. The device of claim 1, further comprising:

creating N+ type source/drain regions self-aligned by the sidewall spacers to the gate electrode in the ESD region.

14. The device of claim 12, further comprising:

creating N+ source/drain regions self-aligned by the sidewall spacers to the gate electrode in the ESD region.

* * * * *

UNITED STATES PATENT AND TRADEMARK OFFICE
CERTIFICATE OF CORRECTION

PATENT NO. : 6,259,140 B1
DATED : July 10, 2001
INVENTOR(S) : Meng-Hwang Liu et al.

It is certified that error appears in the above-identified patent and that said Letters Patent is hereby corrected as shown below:

<u>Title page,</u>
Item [57], ABSTRACT,
Line 4, replace "suicide" with -- silicide --.

<u>Column 3,</u>
Line 45, replace "suicide" with -- silicide --.

<u>Column 5,</u>
Line 55, replace "suicide" with -- silicide --.

<u>Column 6,</u>
Line 48, replace "suicide" with -- silicide --.

Signed and Sealed this

Second Day of May, 2006

JON W. DUDAS
*Director of the United States Patent and Trademark Office*